(12) United States Patent
Hsu et al.

(10) Patent No.: US 12,057,670 B2
(45) Date of Patent: Aug. 6, 2024

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: An-Hsuan Hsu, Taoyuan (TW); Yung-Sheng Lin, Taoyuan (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 572 days.

(21) Appl. No.: 17/219,613

(22) Filed: Mar. 31, 2021

(65) Prior Publication Data

US 2022/0320760 A1 Oct. 6, 2022

(51) Int. Cl.
| | |
|---|---|
| H01R 4/62 | (2006.01) |
| H01R 12/52 | (2011.01) |
| H01R 12/57 | (2011.01) |
| H01R 43/02 | (2006.01) |
| H05K 3/36 | (2006.01) |
| H05K 3/10 | (2006.01) |

(52) U.S. Cl.
CPC ............ *H01R 4/625* (2013.01); *H01R 12/52* (2013.01); *H01R 12/57* (2013.01); *H01R 43/02* (2013.01); *H05K 3/368* (2013.01); *H05K 3/108* (2013.01); *H05K 2203/0723* (2013.01)

(58) Field of Classification Search
CPC .......... H01L 2224/05022; H01L 2224/05571; H01R 4/625
See application file for complete search history.

(56) References Cited

U.S. PATENT DOCUMENTS

| | | | |
|---|---|---|---|
| 7,507,321 B2 | 3/2009 | Aksu et al. | |
| 9,997,467 B2 | 6/2018 | Shao et al. | |
| 10,213,986 B2 | 2/2019 | Lin et al. | |
| 2016/0379913 A1* | 12/2016 | Donnelly | ............... C22C 28/00 228/101 |

* cited by examiner

*Primary Examiner* — Anthony Ho
(74) *Attorney, Agent, or Firm* — FOLEY & LARDNER LLP (57) ABSTRACT

A semiconductor package structure and a method for manufacturing a semiconductor package structure are provided. The semiconductor package structure includes a first substrate, a second substrate, and a solid solution layer. The first substrate includes a first metal layer, and the first metal layer includes a first metal. The second substrate includes a second metal layer. The solid solution layer electrically connects the first metal layer to the second metal layer. The solid solution layer includes a first metal-rich layer.

19 Claims, 11 Drawing Sheets

SEMICONDUCTOR PACKAGE STRUCTURE AND METHOD FOR MANUFACTURING THE SAME

BACKGROUND

1. Technical Field

The present disclosure relates generally to a semiconductor package structure and a method for manufacturing a semiconductor package structure.

2. Description of the Related Art

A lock and key structure (e.g., a conductive pillar locked within a recess of a conductive layer) may be implemented in a metal-to-metal bonding structure (e.g., when bonding dies to a wafer) for reducing possible alignment shifts in the bonding process since the pillar can be guided toward and confined by the recess. However, gaps may be formed between the bottom of the pillar and the recess due to the non-coplanar bonding surfaces of the pillar and the recessed conductive layer. As a result, the electrical connection between the conductive pillar and the recessed conductive layer may be adversely affected.

SUMMARY

In one or more embodiments, a semiconductor package structure includes a first substrate, a second substrate, and a solid solution layer. The first substrate includes a first metal layer, and the first metal layer includes a first metal. The second substrate includes a second metal layer. The solid solution layer electrically connects the first metal layer to the second metal layer. The solid solution layer includes a first metal-rich layer.

In one or more embodiments, a semiconductor package structure includes a first substrate, a second substrate, and an alloy layer. The first substrate includes a protrusion, and the protrusion includes a first metal. The second substrate includes a conductive layer. The alloy layer defines a recess accommodating the protrusion. The alloy layer is in contact with the conductive layer of the second substrate.

In one or more embodiments, a method for fabricating a semiconductor package structure includes the following operations: disposing a first metal layer over a bonding material; performing a pre-bonding operation by heating the first metal layer and the bonding material to a first temperature; and performing a solid solution mixing operation by heating the first metal layer and the bonding material to a second temperature that is higher than the first temperature after the pre-bonding operation.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
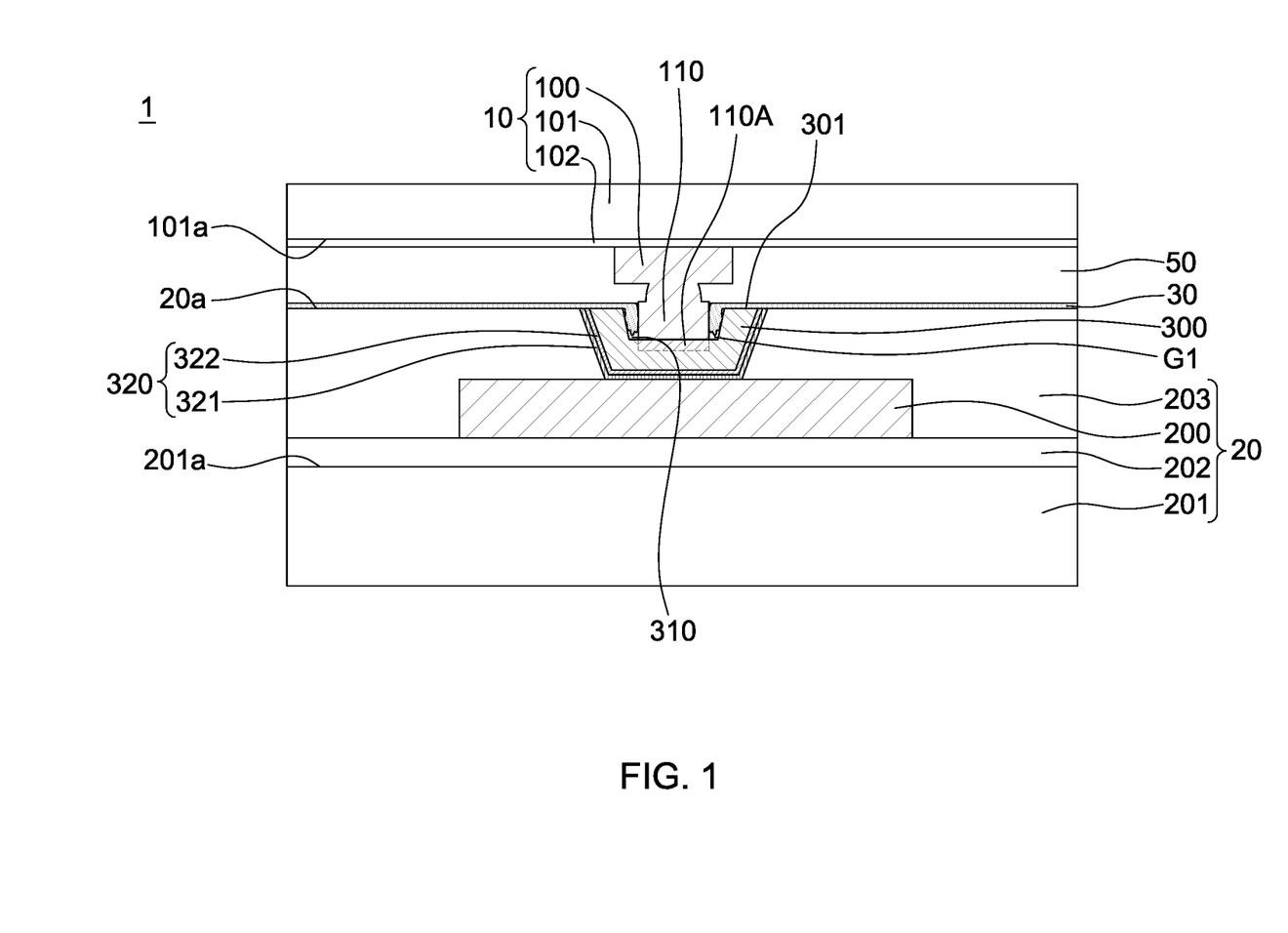
FIG. 1 illustrates a cross-sectional view of a semiconductor package structure in accordance with some embodiments of the present disclosure.

FIG. 1 illustrates a cross-sectional view of a semiconductor package structure 1 in accordance with some embodiments of the present disclosure. The semiconductor package structure 1 includes substrates 10 and 20, an alloy layer 300, an insulating material 30, and a dielectric layer 50.

The substrate 10 may include a metal layer 100. In some embodiments, the metal layer 100 includes a first metal M1. In some embodiments, the metal layer 100 further includes a protrusion 110. In some embodiments, the protrusion 110 of the metal layer 100 includes the first metal M1. In some embodiments, the first metal M1 may include gold (Au), silver (Ag), aluminum (Al), copper (Cu), or an alloy thereof. The substrate 10 may further include a base layer 101, and the metal layer 100 may be disposed on, proximity to, adjacent to, or embedded in and exposed at a surface 101a of the base layer 101. In some embodiments, the substrate 10 may further include a dielectric layer 102 between the base layer 101 and the metal layer 100. The base layer 101 may include, for example, a printed circuit board, such as a paper-based copper foil laminate, a composite copper foil laminate, or a polymer-impregnated glass-fiber-based copper foil laminate. The base layer 101 may include an interconnection structure, such as a redistribution layer (RDL) including a plurality of conductive traces and/or a plurality of through vias, and/or a grounding element. In some embodiments, the metal layer 100 may be electrically connected to the conductive traces and/or through vias of the base layer 101 of the substrate 10. The dielectric layer 102 may include an organic material, a solder mask, PI, ABF, one or more molding compounds, one or more pre-impregnated composite fibers (e.g., a pre-preg material), borophosphosilicate glass (BPSG), silicon oxide, silicon nitride, silicon oxynitride, undoped silicate glass (USG), any combination thereof, or the like.

The substrate 20 may include a conductive layer 200. In some embodiments, the conductive layer 200 may be or include a metal layer. The substrate 20 may further include a base layer 201, and the conductive layer 200 may be disposed on, proximity to, adjacent to, or embedded in and exposed at a surface 201a of the base layer 201. In some embodiments, the substrate 20 may further include a dielectric layer 202 between the base layer 201 and the conductive layer 200. In some embodiments, the conductive layer 200 may be electrically connected to the conductive traces and/or through vias of the base layer 201 of the substrate 20. In some embodiments, the substrate 20 may further include a dielectric layer 203 over the dielectric layer 202. In some embodiments, the dielectric layer 203 may be adjacent to or surround the conductive layer 200. In some embodiments, the dielectric layer 203 defines a recess for accommodating the protrusion 110 of the metal layer 100 of the substrate 10. In some embodiments, the base layer 201 is similar to the base layer 101, the dielectric layers 202 and 203 are similar to the dielectric layer 102, and thus the description thereof is omitted hereinafter.

The alloy layer 300 may electrically connect the metal layer 100 of the substrate 10 to the conductive layer 200 of the substrate 20. In some embodiments, the alloy layer 300 may be or include a solid solution layer. According to some embodiments of the present disclosure, with the design of the alloy layer 300 (or the solid solution layer), gaps which could have been formed between the bottom of the metal layer 100 and the top surface of the conductive layer 200 can be prevented by the arrangement of the alloy layer 300, and thus the electrical connection between the metal layer 100 of the substrate 10 and the conductive layer 200 of the substrate 20 can be improved. For example, while possible alignment shifts can be effectively reduced by the protrusion 110 of the metal layer 100 being guided toward and confined by the recess defined by the dielectric layer 203, gaps which could have been formed between the bottom of the metal layer 100 and the recess defined by the dielectric layer 203 can be prevented by the alloy layer 300 (or the solid solution layer) filled between the metal layer 100 and the recess of the dielectric layer 203. Therefore, the conductive contact area between the metal layer 100 and the conductive layer 200 can be significantly increased, and thus the electrical connection (e.g., the electrical connection uniformity, such as a range of the deviation of resistance or conductivity among the contact area between the metal layer 100 and the conductive layer 200 being less than or equal to ±10% of an average value, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.) between the metal layer 100 of the substrate 10 and the conductive layer 200 of the substrate 20 can be effectively improved.

In some embodiments, the alloy layer 300 includes the first metal M1 as its first composition C1. In some embodiments, the alloy layer 300 includes a first composition-rich layer. In some embodiments, the alloy layer 300 includes greater than about 50 wt % of the first composition C1. In some embodiments, the alloy layer 300 includes at least 70 wt % of the first composition C1. In some embodiments, the alloy layer 300 includes about 80 wt % of the first composition C1.

In some embodiments, the alloy layer 300 may further include a second composition C2, and the second composition C2 has a melting point lower than a melting point of a soldering material. In some embodiments, the alloy layer 300 is a solid solution layer which includes the first composition C1 and the second composition C2. In some embodiments, the second composition C2 of the alloy layer 300 is configured to form a transient liquid phase bonding with the first metal M1 (i.e., the first composition C1) of the metal layer 100. In some embodiments, a formation temperature of the solid solution layer (e.g., the alloy layer 300) is greater than the melting point of the second composition C2. In some embodiments, a diffusion mobility of the second composition C2 in the first metal M1 is greater than a diffusion mobility of the soldering material in the first metal M1. In some embodiments, the second composition C2 of the alloy layer 300 includes gallium (Ga), Ga alloy, indium (In), or a combination thereof.

In some embodiments, the alloy layer 300 includes CuGa alloy, CuIn alloy, or a combination thereof. In some embodiments, the alloy layer 300 is a solid solution layer which includes CuGa alloy, CuIn alloy, or a combination thereof. In some embodiments, the alloy layer 300 is substantially free of an intermetallic compound (IMC). In some embodiments, the alloy layer 300 is substantially free of a composition having a melting point higher than 1100° C. In some embodiments, the alloy layer 300 is substantially free of nickel (Ni). In some embodiments, the alloy layer 300 includes $Cu_xGa_{1-x}$, wherein x is in a range of from about 0.8 to 1. In some embodiments, the alloy layer 300 is a solid solution layer which includes $Cu_xGa_{1-x}$, wherein x is in a range of from about 0.8 to 1. In some embodiments, the alloy layer 300 has a face-centered cubic (FCC) crystal structure. In some embodiments, the alloy layer 300 has a Cu-rich FCC phase.

Instead of adopting a soldering material to serve as the alloy layer 300, according to some embodiments of the present disclosure, the alloy layer 300 is a solid solution layer and substantially free of IMC, and thus the bonding structure between the substrates 10 and 20 can be free of the brittle IMC and having a relatively high mechanical strength as well as reliability. In addition, according to some embodiments of the present disclosure, the second composition C2 has a lower melting point than that of a soldering material so as to form transient liquid phase that facilitate a pre-bonding process in the manufacturing process, which is advantageous to the bonding operation between the substrates 10 and 20. Moreover, according to some embodiments of the present disclosure, the second composition C2 is selected to be capable of forming solid solution with the first metal M1 of the metal layer 100 so that any IMC formed in the pre-bonding process can be transformed to a solid solution layer (i.e., the alloy layer 300) at a subsequent bonding process under a temperature higher than the temperature of the pre-bonding process. Therefore, the as-formed bonding structure can be free of IMC and have the aforementioned advantages.

In some embodiments, the alloy layer 300 is in contact with the metal layer 100 of the substrate 10. In some embodiments, the alloy layer 300 is in contact with the protrusion 110 of the metal layer 100 of the substrate 10. In some embodiments, the alloy layer 300 defines a recess 310 accommodating the protrusion 110. In some embodiments, the alloy layer 300 is adjacent to the protrusion 110. In some embodiments, the alloy layer 300 surrounds the protrusion 110. In some embodiments, a gap G1 is between the alloy layer 300 and the protrusion 110. In some embodiments, the alloy layer 300 is spaced apart from the protrusion 110 by a gap G1. In some embodiments, the protrusion 110 may include a portion 110A embedded in the alloy layer 300. In some embodiments, the portion 110A of the protrusion 110 includes the first composition C1 and the second composition C2. In some embodiments, a ratio of the first composition C1 to the second composition C2 in the portion 110A of the protrusion 110 is different from a ratio of the first composition C1 to the second composition C2 in the alloy layer 300. In some embodiments, the metal layer 100 and the alloy layer 300 form a bonding structure between the substrate 10 and the substrate 20. In some embodiments, the alloy layer 300 is a solid solution layer, and the metal layer 100 and the solid solution layer form a bonding structure between the substrate 10 and the substrate 20. In some embodiments, the portion 110A may be or include a solid solution layer. In some embodiments, a peripheral boundary of the solid solution layer may be between the portion 110A and the alloy layer 300. In some embodiments, the alloy layer 300 is between the solid solution layer (i.e., the portion 110A) and the conductive layer 200. In some embodiments, the portion 110A and a portion of the alloy layer 300 adjacent to the portion 110A in combined may be or include a solid solution layer. In some embodiments, a peripheral boundary of the solid solution layer may be in the alloy layer 300.

In some embodiments, the semiconductor package structure 1 may further include a seed layer 320, and the seed layer 320 is in contact with the conductive layer 200 of the substrate 20. In some embodiments, the seed layer 320 is at a boundary of the alloy layer 300 (or the solid solution layer) and the conductive layer 200. In some embodiments, the seed layer 320 includes sub-layers 321 and 322. In some embodiments, the sub-layer 321 includes titanium (Ti), and the sub-layer 322 includes Cu. In some embodiments, a thickness of the sub-layer 321 may be about 1 nm, and a thickness of the sub-layer 322 may be about 2 nm. In some embodiments, the alloy layer 300 may be formed by plating with a current density of about 30 mA/cm$^2$, and the seed layer 320 (e.g., the sub-layers 321 and 322) may serve for applying current in the plating process of the alloy layer 300.

The insulating material 30 may be between the alloy layer 300 and the protrusion 110 of the metal layer 100 of the substrate 10. In some embodiments, the insulating material 30 is filled in the gap G1. In some embodiments, voids may be existed between the insulating material 30 and the alloy layer 300. In some embodiments, voids may be existed between the insulating material 30 and the protrusion 110. In some embodiments, the insulating material 30 is on a top surface 301 of the alloy layer 300 and in the recess 310 defined by the alloy layer 300. In some embodiments, the insulating material 30 is further in contact with an upper surface 20a of the substrate 20. In some embodiments, the insulating material 30 is further in contact with an upper surface (i.e., the surface 20a) of the dielectric layer 203 of the substrate 20. In some embodiments, the insulating material 30 includes a dielectric layer, an underfill, a polymeric material, or a combination thereof. In some embodiments, the insulating material 30 includes a dielectric material having a coefficient of thermal expansion (CTE) greater than that of the metal layer 100. In some embodiments, the insulating material 30 includes a polymeric binder, such as a non-conductive film (NCF), one or more benzocyclobutene (BCB) derivatives, a photoresist (PR), or a combination thereof.

The dielectric layer 50 may be between the substrate 10 and the substrate 20. In some embodiments, the dielectric layer 50 is between the insulating material 30 and the dielectric layer 102. In some embodiments, the dielectric layer 50 is in contact with the protrusion 110 of the metal layer 100 of the substrate 10. In some embodiments, the dielectric layer 50 is similar to the dielectric layer 102, and thus the description thereof is omitted hereinafter.

Figure 2A:
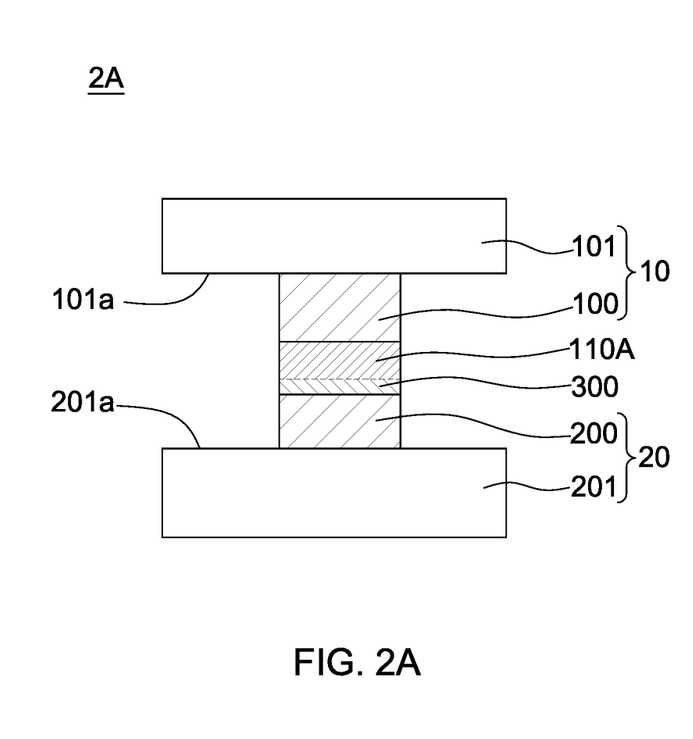
FIG. 2A illustrates a cross-sectional view of a semiconductor package structure in accordance with some embodiments of the present disclosure.

FIG. 2A illustrates a cross-sectional view of a semiconductor package structure 2A in accordance with some embodiments of the present disclosure. The semiconductor package structure 2A is similar to the semiconductor package structure 1 in FIG. 1, and the differences are as described below.

In some embodiments, the metal layer 100 of the substrate 10 is connected to the conductive layer 200 of the substrate 20 through the alloy layer 300. In some embodiments, the alloy layer 300 is a solid solution layer, and the metal layer 100 of the substrate 10 is connected to the conductive layer 200 of the substrate 20 through the solid solution layer. In some embodiments, the alloy layer 300 is connected to the portion 110A of the metal layer 100, and the alloy layer 300 and the portion 110A of the metal layer 100 both includes the first composition C1 and the second composition C2. In some embodiments, a ratio of the first composition C1 to the second composition C2 in the portion 110A of the metal layer 100 is different from a ratio of the first composition C1 to the second composition C2 in the alloy layer 300.

In some embodiments, the bonding structure between the substrate 10 and the substrate 20 is free from being in contact with or surrounded by an insulating material. In some embodiments, the metal layer 100 is disposed on a surface 101a of the base layer 101, and the conductive layer 200 is disposed on a surface 201a of the base layer 201. In some embodiments, the metal layer 100 and the conductive layer 200 may include conductive pillars, such as copper pillars. In some other embodiments, the conductive layer 200 may be proximity to, adjacent to, or embedded in and exposed at the surface 201a of the base layer 201.

Figure 2B:
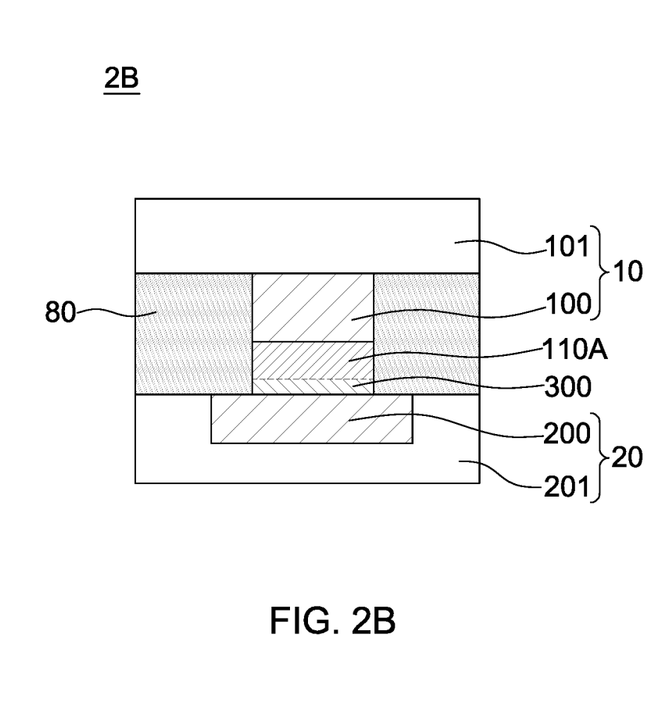
FIG. 2B illustrates a cross-sectional view of a semiconductor package structure in accordance with some embodiments of the present disclosure.

FIG. 2B illustrates a cross-sectional view of a semiconductor package structure 2B in accordance with some embodiments of the present disclosure. The semiconductor package structure 2B is similar to the semiconductor package structure 1 in FIG. 1, and the differences are as described below.

In some embodiments, the semiconductor package structure 2B may further include a dielectric layer 80. In some embodiments, the bonding structure between the substrate 10 and the substrate 20 is in contact with the dielectric layer 80. In some embodiments, the bonding structure between the substrate 10 and the substrate 20 is adjacent to the dielectric layer 80. In some embodiments, the bonding structure between the substrate 10 and the substrate 20 is surrounded by the dielectric layer 80. In some embodiments, the alloy layer 300 is in contact with the dielectric layer 80. In some embodiments, the alloy layer 300 is surrounded by the dielectric layer 80. In some embodiments, the protrusion 110A of the metal layer 100 is in contact with the dielectric layer 80. In some embodiments, the protrusion 110A of the metal layer 100 is adjacent to the dielectric layer 80. In some embodiments, the protrusion 110A of the metal layer 100 is surrounded by the dielectric layer 80. In some embodiments, the metal layer 100 is disposed on a surface 101a of the base layer 101, and the conductive layer 200 may be proximity to, adjacent to, or embedded in and exposed at the surface 201a of the base layer 201. In some embodiments, the metal layer 100, the alloy layer 300, and the dielectric layer 80 form a hybrid bonding structure between the substrates 10 and 20. In some embodiments, the dielectric layer 80 is similar to the dielectric layer 102, and thus the description thereof is omitted hereinafter.

Figure 3A:
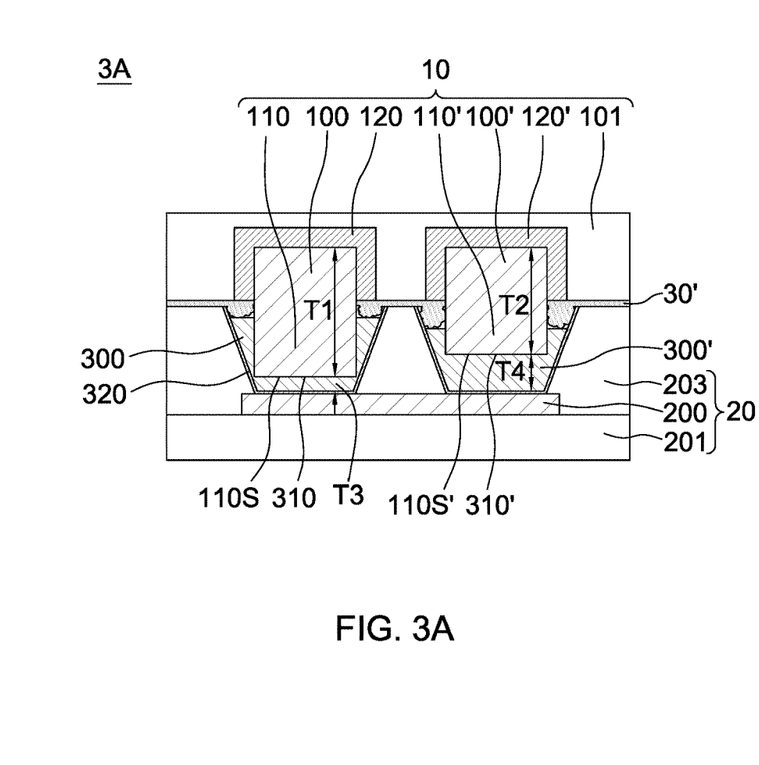
FIG. 3A illustrates a cross-sectional view of a semiconductor package structure in accordance with some embodiments of the present disclosure.

FIG. 3A illustrates a cross-sectional view of a semiconductor package structure 3A in accordance with some embodiments of the present disclosure. The semiconductor package structure 3A is similar to the semiconductor package structure 1 in FIG. 1, and the differences are as described below.

In some embodiments, the substrate 10 includes a plurality of metal layers (e.g., metal layers 100 and 100'). In some embodiments, the metal layers 100 and 100' each includes a protrusion 110 and a protrusion 110'. In some embodiments, portions of the metal layers 100 and 100' are embedded in the base layer 101. In some embodiments, the base layer 101 defines recesses for accommodating the embedded portions of the metal layers 100 and 100'. In some embodiments, the substrate 10 further includes buffer layers 120 and 120' each between the base layer 101 and the embedded portions of the metal layers 100 and 100', respectively. In some embodiments, the buffer layers 120 and 120' may each include a seed layer, a soldering layer, or an alloy layer including the first composition C1 and the second composition C2. In some embodiments, the semiconductor package structure 3A includes a plurality of alloy layers (e.g., alloy layers 300 and 300'). In some embodiments, the alloy layers 300 and 300' each defines a recess 310 accommodating the protrusion 110 and a recess 310' accommodating the protrusion 110'. In some embodiments, the alloy layers 300 and 300' are connected to the conductive layer 200 of the substrate 20. In some embodiments, a portion of the protrusion 110 penetrates through the alloy layer 300 and contacts a sidewall of the dielectric layer 203 of the substrate 20.

In some embodiments, a contact interface 110S of the protrusion 110 and the alloy layer 300 is free from lateral alignment to a contact interface 110S' of the protrusion 110' and the alloy layer 300'. In some embodiments, the contact interface 110S of the protrusion 110 and the alloy layer 300 is at an elevation different from an elevation of a contact interface 110S' of the protrusion 110' and the alloy layer 300'. In some embodiments, the contact interface 110S and the contact interface 110S' are substantially planar surfaces. In some embodiments, a thickness T1 of the metal layer 100 is different from a thickness T2 of the metal layer 100'. In some embodiments, a thickness T3 of the alloy layer 300 is different from a thickness T4 of the alloy layer 300'. In some embodiments, the thickness T3 refers to the thickness of the portion of the alloy layer 300 below the recess 310, and the thickness T4 refers to the thickness of the portion of the alloy layer 300' below the recess 310'. In some embodiments, a sum of the thickness T1 and the thickness T3 may be substantially the same as a sum of the thickness T2 and the thickness T4. In some embodiments, the thickness T1 of the metal layer 100 and the thickness T2 of the metal layer 100' may be in a range from about 4.5 μm to about 5.5 In some embodiments, the thickness T3 of the alloy layer 300 and the thickness T4 of the alloy layer 300' may be in a range from about 0.5 μm to about 1.5 μm.

Figure 3B:
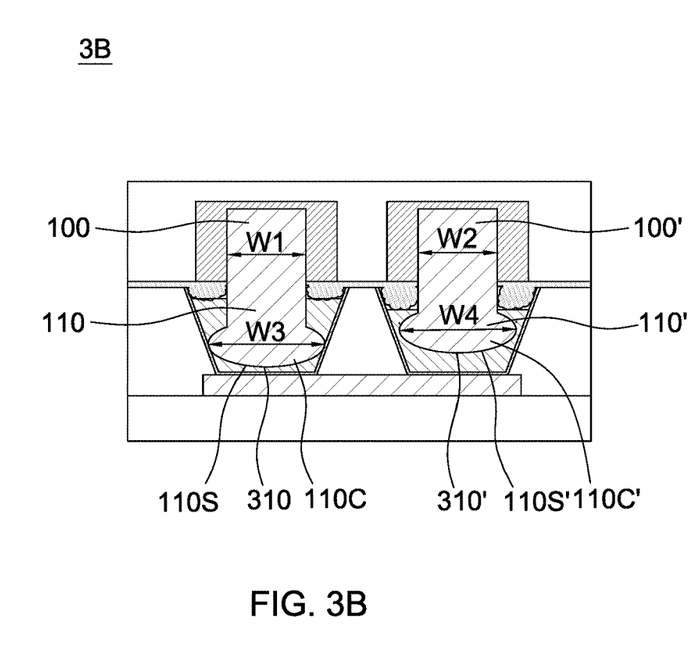
FIG. 3B illustrates a cross-sectional view of a semiconductor package structure in accordance with some embodiments of the present disclosure.

FIG. 3B illustrates a cross-sectional view of a semiconductor package structure 3B in accordance with some embodiments of the present disclosure. The semiconductor package structure 3B is similar to the semiconductor package structure 3A in FIG. 3A, and the differences are as described below.

In some embodiments, the contact interface 110S of the protrusion 110 and the alloy layer 300 is a non-planar surface. In some embodiments, the protrusion 110 has a curved portion 110C facing the alloy layer 300. In some embodiments, a width W3 of the protrusion 110 is greater than a width W1 of the embedded portion of the metal layer 100. In some embodiments, the contact interface 110S' of the protrusion 110' and the alloy layer 300' is a non-planar surface. In some embodiments, the protrusion 110' has a curved portion 110'C facing the alloy layer 300'. In some embodiments, a width W4 of the protrusion 110' is greater than a width W2 of the embedded portion of the metal layer 100'. According to some embodiments of the present disclosure, with the aforesaid design of the protrusion 110, a greater bonding area and a locking effect between the protrusion 110 and the alloy layer 300 can be provided, and thus the bonding strength between the protrusion 110 and the alloy layer 300 may be increased.

Figure 3C:
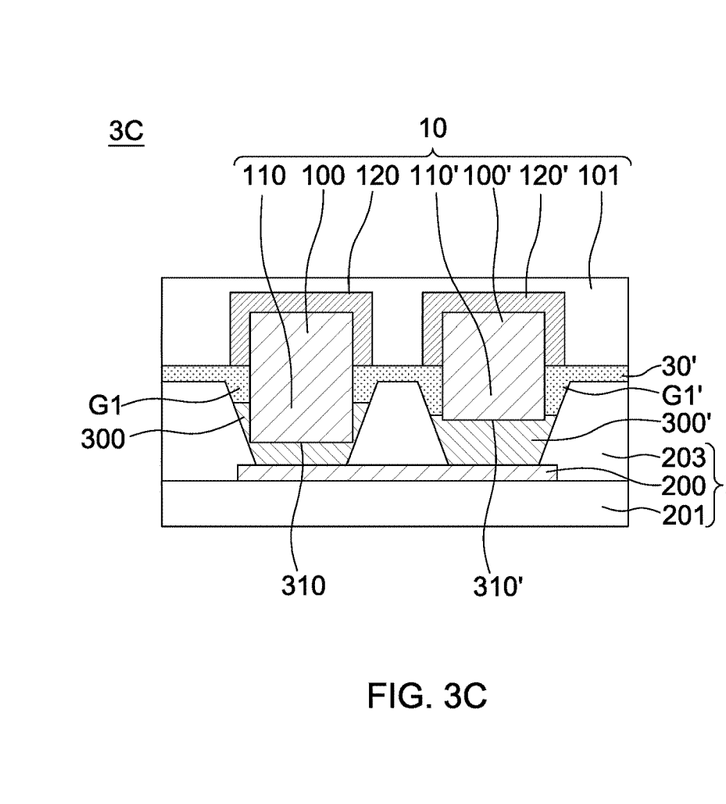
FIG. 3C illustrates a cross-sectional view of a semiconductor package structure in accordance with some embodiments of the present disclosure.

FIG. 3C illustrates a cross-sectional view of a semiconductor package structure 3C in accordance with some embodiments of the present disclosure. The semiconductor package structure 3C is similar to the semiconductor package structure 3A in FIG. 3A, and the differences are as described below.

In some embodiments, the insulating material 30' is filled in the gaps G1 and G1'. In some embodiments, the semiconductor package structure 3C may be free of voids between the insulating material 30' and the alloy layer 300. In some embodiments, the semiconductor package structure 3C may be free of voids between the insulating material 30' and the protrusion 110. In some embodiments, the insulating material 30' includes a dielectric layer such as silicon oxide, silicon nitride, silicon oxynitride, an underfill, or a combination thereof.

Figure 3D:
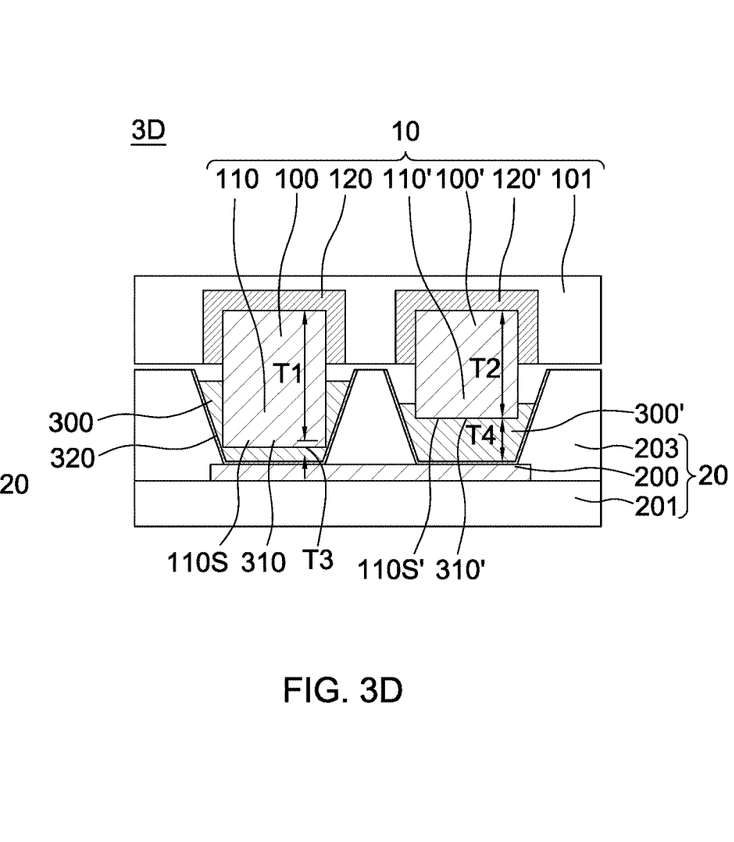
FIG. 3D illustrates a cross-sectional view of a semiconductor package structure in accordance with some embodiments of the present disclosure.

FIG. 3D illustrates a cross-sectional view of a semiconductor package structure 3D in accordance with some embodiments of the present disclosure. The semiconductor package structure 3D is similar to the semiconductor package structure 3A in FIG. 3A, and the differences are as described below.

In some embodiments, the semiconductor package structure 3D may be free from an insulating material between the substrate 10 and the substrate 20. In some embodiments, the base layer 101 and the base layer 201 are spaced apart from a gap.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L illustrate various operations in a method of manufacturing a semiconductor package structure 1 in accordance with some embodiments of the present disclosure.

Figure 4A:
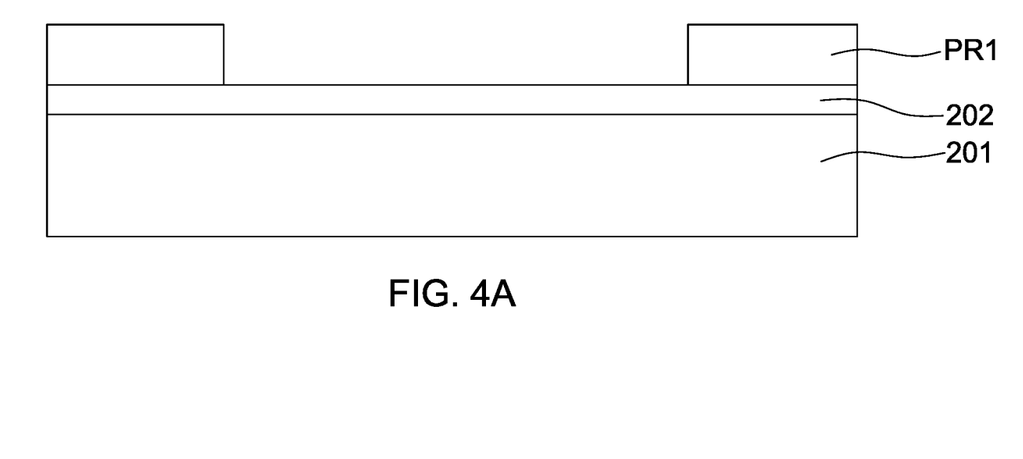
FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L illustrate various operations in a method of manufacturing a semiconductor package structure in accordance with some embodiments of the present disclosure.

Referring to FIG. 4A, a dielectric layer 202 may be formed on a base layer 201, and a patterned photoresist PR1 may be formed on the dielectric layer 202 and exposing a portion of the dielectric layer 202. The dielectric layer 202 may be formed by deposition technique, such as a chemical vapor deposition (CVD) process or other suitable deposition process.

Figure 4B:
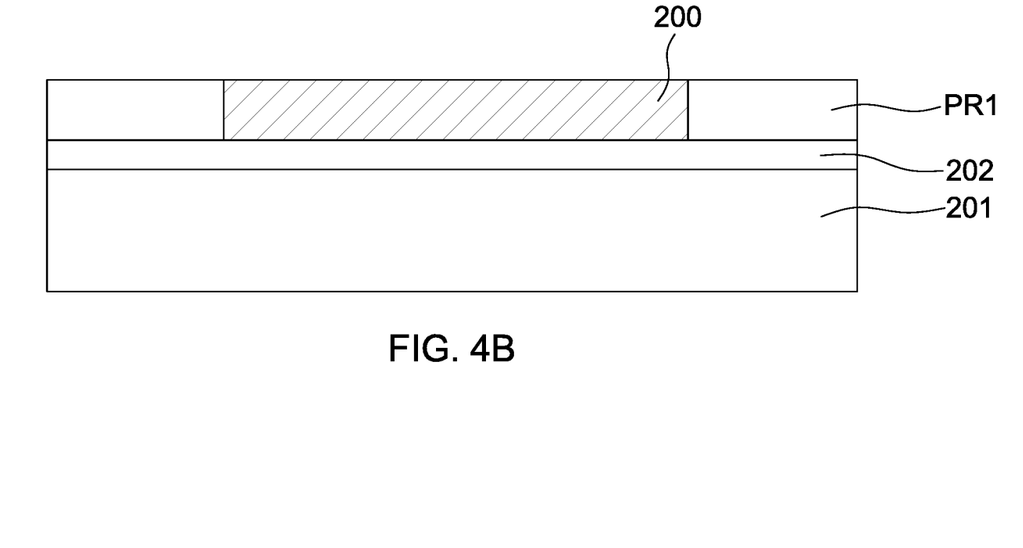

Referring to FIG. 4B, a conductive layer 200 may be formed on the portion of the dielectric layer 202 exposed form the patterned photoresist PR1. The conductive layer 200 may be formed by electrochemical deposition (ECD) technique.

Figure 4C:
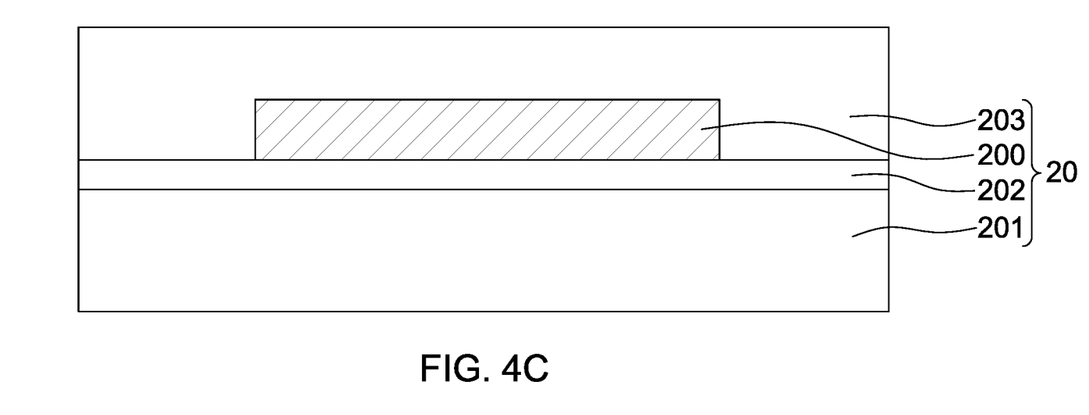

Referring to FIG. 4C, the photoresist PR1 may be removed, and a dielectric layer 203 may be formed covering the conductive layer 200 and the dielectric layer 202. The dielectric layer 203 may be formed by coating.

Figure 4D:
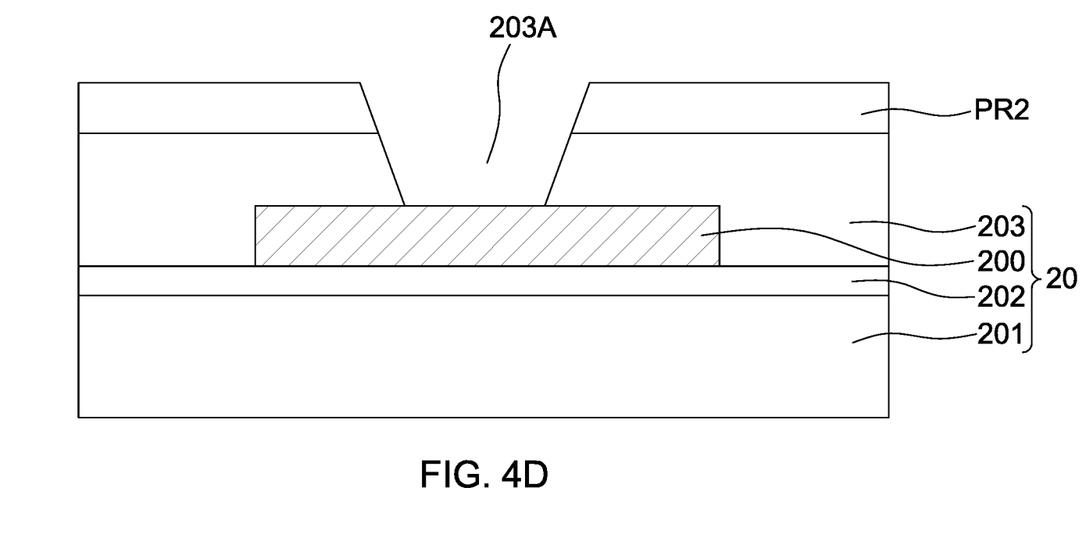

Referring to FIG. 4D, a patterned photoresist PR2 may be formed on the dielectric layer 203 and exposing a portion of the dielectric layer 203, and the exposed portion of the dielectric layer 203 may be removed by etching using the patterned photoresist PR2 as a mask to expose a portion of the conductive layer 200. The as-formed dielectric layer 203 defines a patterned recess 203A exposing a portion of the conductive layer 200. As such, the base layer 201, the dielectric layers 202 and 203, and the conductive layer 200 form a substrate 20.

Figure 4E:
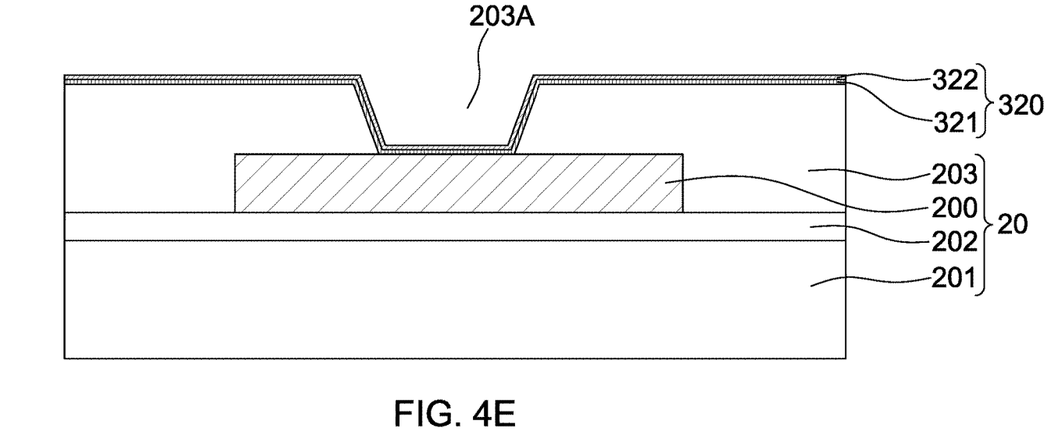

Referring to FIG. 4E, the patterned photoresist PR2 may be removed, and a seed layer 320 may be formed in the patterned recess 203A over the conductive layer 200. In some embodiments, the seed layer 320 may be formed on the dielectric layer 203 and the exposed portion of the conductive layer 200 in the patterned recess 203A. The seed layer 320 may be formed by the following operations: forming a sub-layer 321 on the dielectric layer 203 and the exposed portion of the conductive layer 200; and forming a sub-layer 322 on the sub-layer 321.

Figure 4F:
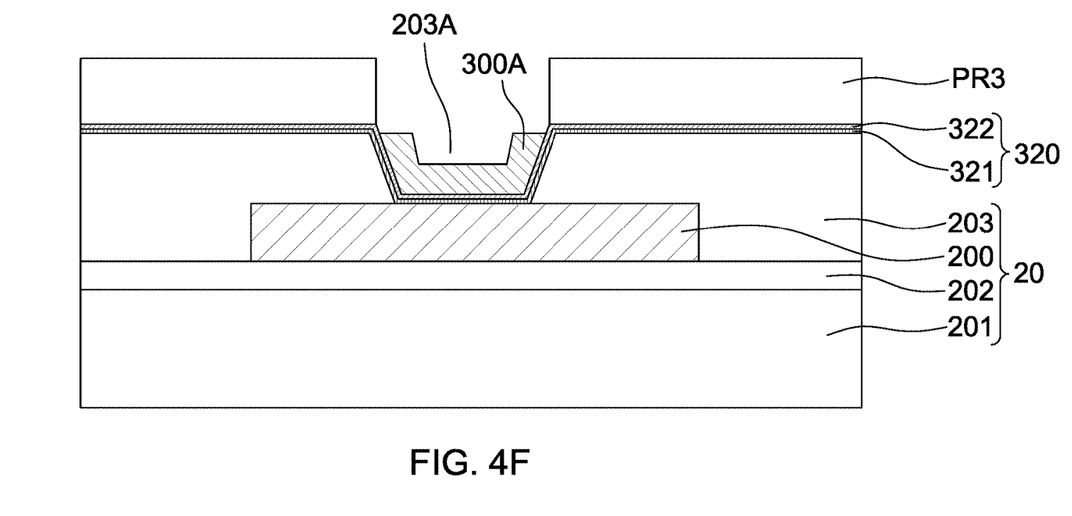

Referring to FIG. 4F, a bonding material 300A may be formed on the conductive layer 200. In some embodiments, a patterned photoresist PR3 may be formed over the seed layer 320 and exposing the patterned recess 203A. In some embodiments, the bonding material 300A may be formed in the patterned recess 203A. In some embodiments, the bonding material 300A may be formed on the seed layer 320 in the patterned recess 203A. In some embodiments, the bonding material 300A may be formed by plating. In some embodiments, the current density of the plating process may be about 30 mA/cm². In some embodiments, the bonding material 300A may have a melting point lower than a melting point of a soldering material. In some embodiments, the bonding material 300A may be or include a composition C2. In some embodiments, the bonding material 300A may be or include Ga, Ga alloy, In, or a combination thereof. In some embodiments, a thickness of the bonding material 300A may be from 1 μm to about 1.5 μm.

Figure 4G:
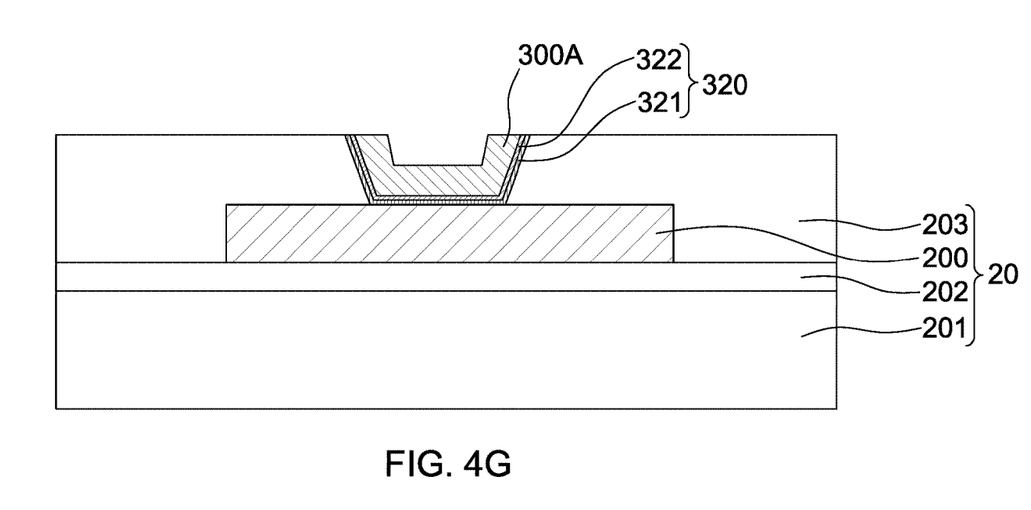

Referring to FIG. 4G, the patterned photoresist PR3 and portions of the seed layer 320 under the patterned photoresist PR3 may be removed.

Figure 4H:
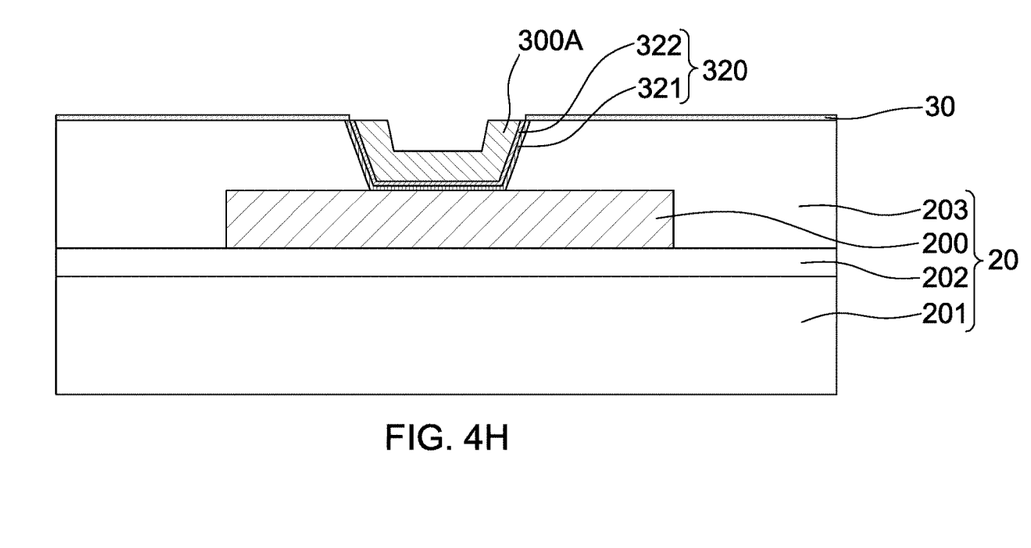

Referring to FIG. 4H, an insulating material 30 may be formed over the bonding material 300A. In some embodiments, the insulating material 30 is formed on the dielectric layer 203 and exposing the bonding material 300A. The insulating material 30 may be formed by coating.

Figure 4I:
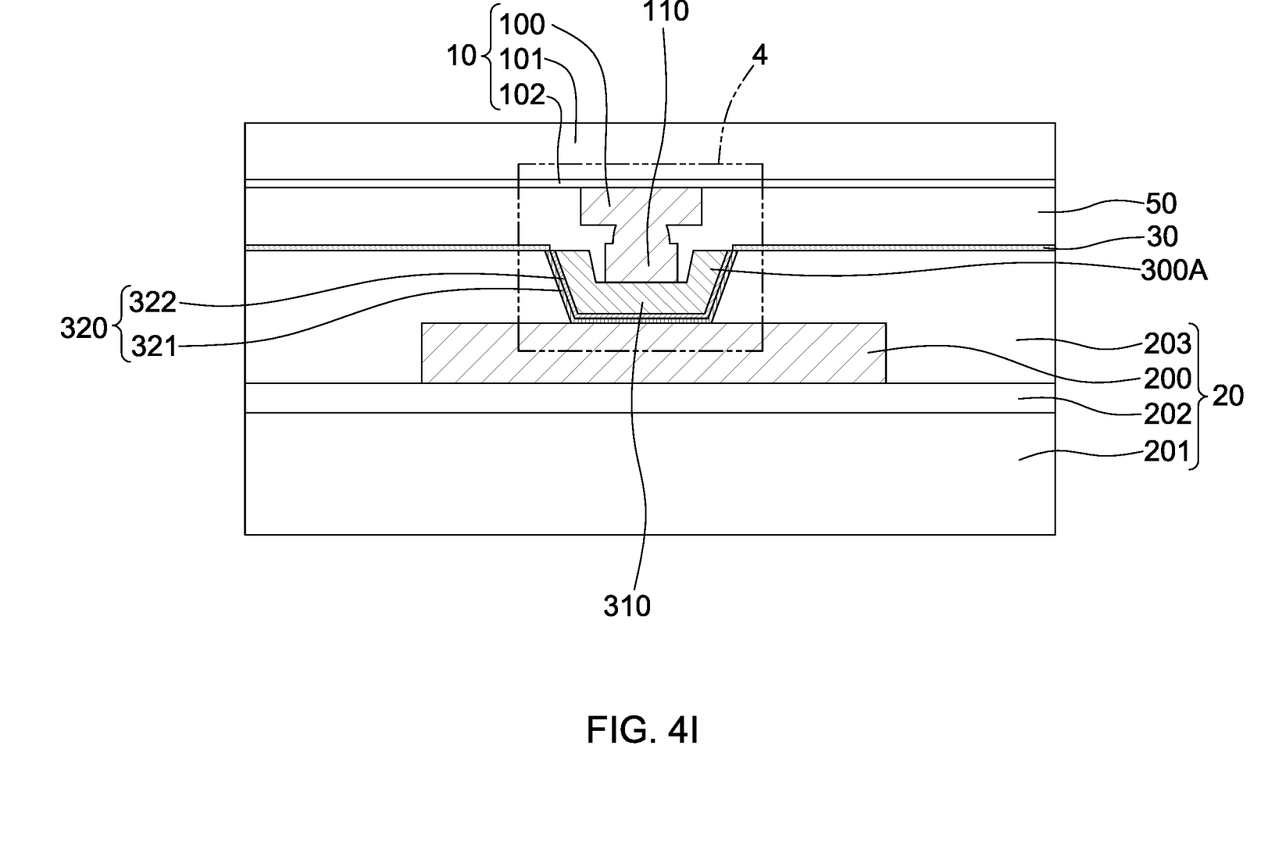

Referring to FIG. 4I, a metal layer 100 is disposed over the bonding material 300A. In some embodiments, the metal layer 100 may contact the bonding material 300A. In some embodiments, a substrate 10 including a base layer 101, a dielectric layer 102 on the base layer 101, and the metal layer 100 including a protrusion 110 is provided, and a dielectric layer 50 is formed on the dielectric layer 102 exposing the protrusion 110 of the metal layer 100. In some embodiments, the metal layer 100 includes a first metal M1 or a composition C1. In some embodiments, the substrate 10 is flipped over with the metal layer 100 facing the bonding material 300A, and then the metal layer 100 is contacting with the bonding material 300A.

Figure 4J:
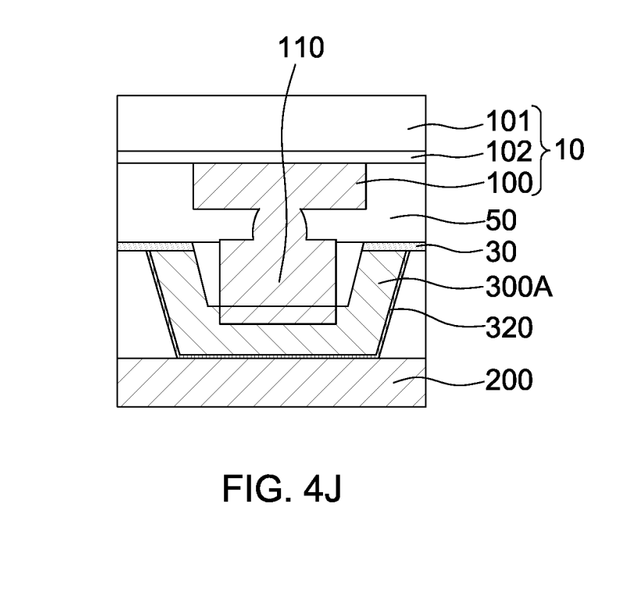

Referring to FIG. 4J, FIG. 4J illustrates an enlarged cross-sectional view of a portion 4 of the intermediate structure illustrated in FIG. 4I after the operations illustrated in FIG. 4I. A pre-bonding operation may be performed by heating the metal layer 100 and the bonding material 300A to a first temperature Tm1. In some embodiments, the first temperature Tm1 may be substantially equal to or greater than a melting point of the bonding material 300A. In some embodiments, the first temperature Tm1 may be lower than about 50° C. In some embodiments, the first temperature Tm1 may be lower than a melting point of a soldering material so as to form transient liquid phase that facilitates the pre-bonding at the first temperature Tm1. In some embodiments, the bonding material 300A starts to melt when being heated under the first temperature Tm1. In some embodiments, the bonding material 300A melts and contacts the protrusion 110 of the metal layer 100 after performing the pre-bonding operation. In some embodiments, a portion of the protrusion 110 of the metal layer 100 may be within the melted bonding material 300A, and thus the variety of the shape of the protrusion 110 can be increased without sacrificing the bonding strength and the electrical connection uniformity.

Figure 4K:
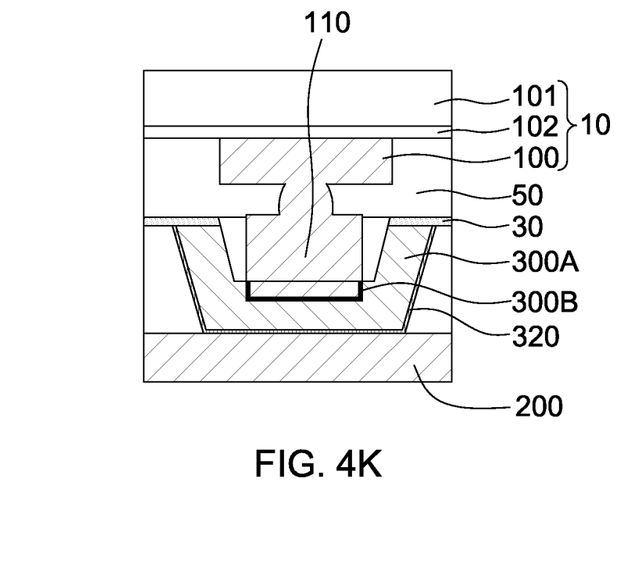

Referring to FIG. 4K, FIG. 4K illustrates an enlarged cross-sectional view of the portion 4 of the intermediate structure after the operations illustrated in FIG. 4J. In some embodiments, the pre-bonding operation may be performed to generate a transient liquid phase bonding 300B between the bonding material 300A and the metal layer 100. In some embodiments, the composition C2 of the bonding material 300A is configured to form the transient liquid phase bonding 300B with the first metal M1 (i.e., the composition C1) of the metal layer 100. In some embodiments, the transient liquid phase bonding 300B includes an intermetallic compound (IMC). In some embodiments, the transient liquid phase bonding 300B includes an IMC of the first metal M1 (i.e., the composition C1) and the composition C2. At this stage, the metal layer 100 is pre-bonded to the bonding material 300A through the transient liquid phase bonding 300B (e.g., IMC). In some embodiments, a ratio (C1/C2) of the compositions C1 to C2 in the bonding material 300A remains substantially the same prior to and after the pre-bonding operation. According to some embodiments of the present disclosure, by forming the bonding material 300A including the composition C2 with the aforesaid properties, the transient liquid phase 300B that can facilitate the pre-bonding operation can be formed under a relatively low temperature, which is advantageous to preventing components/devices from being damaged by a high temperature operation in the bonding operation (e.g., warpage and/or peeling issues) and reducing the cost since the processing temperature (i.e., the first temperature Tm1) is relatively low.

Figure 4L:
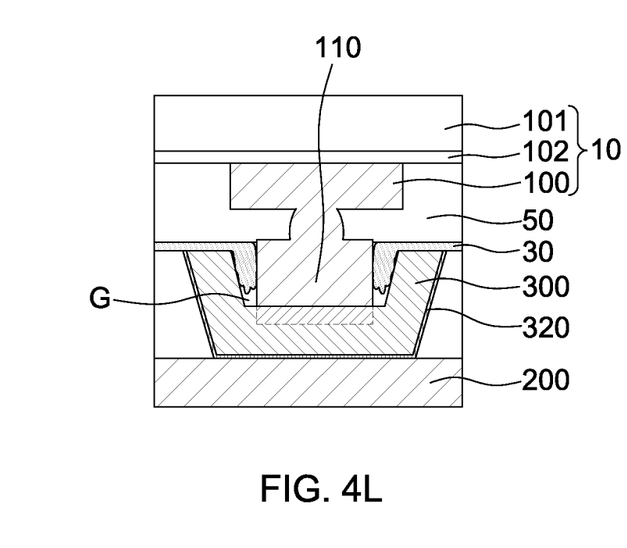

Referring to FIG. 4L, FIG. 4L illustrates an enlarged cross-sectional view of the portion 4 of the intermediate structure after the operations illustrated in FIG. 4K. In some embodiments, a solid solution mixing operation may be performed by heating the metal layer 100 and the bonding material 300A to a second temperature Tm2 that is higher than the first temperature Tm1 after the pre-bonding operation. In some embodiments, the second temperature Tm2 is from about 100° C. to about 200° C. In some embodiments, the second temperature Tm2 may be lower than a melting point of a soldering material. In some embodiments, the solid solution mixing operation may be performed by heating the metal layer 100 and the bonding material 300A for about 1 hour to about 24 hours.

In some embodiments, the solid solution mixing operation may be performed to transform the bonding material 300A and a portion of the metal layer 100 into a solid solution layer (i.e., layer 300). In some embodiments, the ratio (C1/C2) of the compositions C1 to C2 in the solid solution layer (i.e., layer 300) is greater than that in the bonding material 300A after the solid solution mixing operation. For example, from about 0.5 to about 3.6. In some embodiments, since the bonding material 300A is selected to be capable of forming solid solution with the first metal M1 of the metal layer 100, any IMC formed in the pre-bonding operation can be transformed to the solid solution layer (i.e., layer 300) at the second temperature Tm2 that is higher than the first temperature Tm1. Therefore, the as-formed solid solution layer (i.e., layer 300) can be free of IMC, thus the electrical connection performance of the bonding structure including the metal layer 100 and the solid solution layer can be prevented from being adversely affected by the presence of IMC, and the as-formed bonding structure can have relatively high bonding strength and reliability. In addition, the second temperature Tm2 can be still be relatively low compared to high temperature process (e.g., a soldering annealing process).

In some embodiments, the insulating material 30 may be cured at the second temperature Tm2 when performing the solid solution mixing operation. In some embodiments, the insulating material 30 has a coefficient of thermal expansion (CTE) greater than that of the metal layer 100, and thus the insulating material 30 expands to fill in the gap G1 between the protrusion 110 and the solid solution layer (i.e., layer 300), as illustrated in FIG. 4L. As such, the semiconductor package structure 1 illustrated in FIG. 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   a first substrate comprising a first metal layer, the first metal layer comprising a first metal;
   a second substrate comprising a second metal layer; and
   a first solid solution layer electrically connecting the first metal layer to the second metal layer, wherein the first solid solution layer comprises a first metal-rich layer;
   wherein the first solid solution layer comprises a first composition being the first metal, and the first solid solution layer further comprises a second composition, the second composition having a melting point lower than a melting point of a soldering material.

2. The semiconductor package structure of claim 1, wherein a diffusion mobility of the second composition in the first metal is greater than a diffusion mobility of the soldering material in the first metal.

3. The semiconductor package structure of claim 1, wherein the first solid solution layer comprises $Cu_xGa_{1-x}$, wherein x is in a range of from about 0.8 to 1.

4. The semiconductor package structure of claim 1, wherein the second composition of the first solid solution layer comprises gallium (Ga), Ga alloy, indium (In), or a combination thereof, and the first solid solution layer comprises CuGa alloy, CuIn alloy, or a combination thereof.

5. The semiconductor package structure of claim 1, wherein the first metal layer is in contact with the first solid solution layer.

6. The semiconductor package structure of claim 5, further comprising a seed layer at a boundary of the first solid solution layer and the second metal layer.

7. The semiconductor package structure of claim 1, wherein the first substrate further comprises a third metal layer adjacent to the first metal layer, a length of the first metal layer is different from a length of the third metal layer, the semiconductor package structure further comprises a second solid solution layer electrically connected to the third metal layer, and the second solid solution layer comprises an another first metal-rich layer.

8. The semiconductor package structure of claim 7, wherein a thickness of the first solid solution layer is different from a thickness of the second solid solution layer.

9. A semiconductor package structure, comprising:
a first substrate comprising a first metal layer, the first metal layer comprising a first metal;
a second substrate comprising a second metal layer; and
a first solid solution layer electrically connecting the first metal layer to the second metal layer, wherein the first solid solution layer comprises a first metal-rich layer;
wherein the first metal layer further comprises a first protrusion and a second protrusion, and wherein a first contact interface of the first protrusion and the first solid solution layer is at an elevation different from an elevation of a second contact interface of the second protrusion and the first solid solution layer.

10. The semiconductor package structure of claim 9, further comprising an insulating material between the first solid solution layer and the first protrusion.

11. A semiconductor package structure, comprising:
a first substrate comprising a first protrusion, the first protrusion comprising a first metal;
a second substrate comprising a conductive layer; and
a first alloy layer defining a first recess accommodating the first protrusion, the first alloy layer being in contact with the conductive layer of the second substrate.

12. The semiconductor package structure of claim 11, wherein the first alloy layer comprises a solid solution layer in contact with the first protrusion of the first substrate.

13. The semiconductor package structure of claim 12, wherein the first alloy layer comprises CuGa alloy, CuIn alloy, or a combination thereof.

14. The semiconductor package structure of claim 12, wherein the first alloy layer is substantially free of an IMC.

15. The semiconductor package structure of claim 11, further comprising a gap between the first alloy layer and the first protrusion of the first substrate.

16. The semiconductor package structure of claim 15, further comprising an insulating material filled in the gap.

17. The semiconductor package structure of claim 11, wherein the first alloy layer further comprising a seed layer in contact with the conductive layer.

18. The semiconductor package structure of claim 11, wherein the first substrate further comprises a second protrusion adjacent to the first protrusion, a length of the first protrusion is different from a length of the second protrusion, the semiconductor package structure further comprises a second alloy layer electrically connected to the conductive layer of the second substrate, and the second alloy layer comprises a first metal-rich layer.

19. The semiconductor package structure of claim 18, wherein a thickness of the first alloy layer is different from a thickness of the second alloy layer.

* * * * *